(12) United States Patent
Kato

(10) Patent No.: US 7,522,893 B2
(45) Date of Patent: Apr. 21, 2009

(54) RADIO RECEIVER AND RADIO TRANSMITTER

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 397 days.

(21) Appl. No.: 10/595,248

(22) PCT Filed: Sep. 6, 2005

(86) PCT No.: PCT/JP2005/016280

§ 371 (c)(1),
(2), (4) Date: Mar. 29, 2006

(87) PCT Pub. No.: WO2006/073013

PCT Pub. Date: Jul. 13, 2006

(65) Prior Publication Data

US 2008/0254755 A1    Oct. 16, 2008

(30) Foreign Application Priority Data

Jan. 6, 2005    (JP)    ............................. 2005-001587

(51) Int. Cl.
*H03J 7/32* (2006.01)
*H04B 1/06* (2006.01)

(52) U.S. Cl. .................. 455/130; 455/148; 455/255

(58) Field of Classification Search ................ 455/136, 455/147–148, 167.1, 196.1, 226.1, 255–259; 375/344
See application file for complete search history.

(56) References Cited

U.S. PATENT DOCUMENTS

| 4,149,122 A | * | 4/1979 | Parato ..................... 455/226.1 |
| 4,152,650 A | * | 5/1979 | Bennett, Jr. ................. 380/38 |
| 4,709,407 A | * | 11/1987 | Baba ....................... 455/226.1 |
| 5,289,506 A | * | 2/1994 | Kitayama et al. ........... 375/344 |
| 5,335,348 A | * | 8/1994 | Kono ...................... 455/192.2 |
| 5,389,930 A | | 2/1995 | Ono |

(Continued)

FOREIGN PATENT DOCUMENTS

JP    53-047313 U    4/1978

(Continued)

OTHER PUBLICATIONS

International Search Report for PCT Application No. PCT/JP2005/016280, mailed Nov. 22, 2005.

(Continued)

*Primary Examiner*—Simon D Nguyen
(74) *Attorney, Agent, or Firm*—Keating & Bennett, LLP

(57) ABSTRACT

In a radio receiver including an aerial wire (1) that receives a radio signal in which a transmission signal is superimposed on a carrier, a (VCXO 2) that oscillates a local oscillation signal, a frequency multiplier (3), and a demodulation circuit that demodulates the transmission signal on the basis of the radio signal and the local oscillation signal, an oscillation frequency control circuit that repeatedly sweeps the frequency of the local oscillation signal over a frequency bandwidth that is equal to or more than the width of a frequency drift in a carrier frequency from the aerial wire (1) or over a frequency bandwidth that is equal to or more than the width of a frequency drift in the local oscillation signal is provided.

9 Claims, 3 Drawing Sheets

U.S. PATENT DOCUMENTS

| | | | |
|---|---|---|---|
| 6,335,953 B1 * | 1/2002 | Sanderford et al. | 375/344 |
| 6,507,308 B1 * | 1/2003 | Ono et al. | 342/20 |
| 7,359,448 B2 * | 4/2008 | King et al. | 375/268 |

FOREIGN PATENT DOCUMENTS

| | | |
|---|---|---|
| JP | 05-291978 | 11/1993 |
| JP | 07-142961 | 6/1995 |
| JP | 08-139773 | 5/1996 |
| JP | 09-324566 | 12/1997 |
| JP | 11-348732 | 12/1999 |

OTHER PUBLICATIONS

Official communication issued in the counterpoint Korean Application No. 10-2006-7006064, mailed on Apr. 30, 2007.

Official communication issued in counterpart Chinese Application No. 20050000940, mailed on Aug. 8, 2008.

* cited by examiner

RADIO RECEIVER AND RADIO TRANSMITTER

BACKGROUND OF THE INVENTION

1. Field of the Invention

The present invention relates to radio receivers and radio transmitters that compensate for the influence of frequency drifts in oscillation circuits that generate carriers, local oscillation signals, and other signals.

2. Description of the Related Art

In radio communications, such as a keyless entry system that requires a short time to transmit and receive a control code having a short length, a radio transmitter transmits a radio signal on which information, such as an identification code and a control code that are allocated for each object, is superimposed, and a radio receiver receives the radio signal and demodulates the codes. Then, in accordance with the demodulated codes, a controller authenticates the object and locks/unlocks a door.

In such radio communications, the radio transmitter must include an oscillation circuit that oscillates a high-frequency signal, which functions as a carrier, and the radio receiver must include a local oscillation circuit that performs frequency conversion. In addition, the radio signal must be transmitted and received in a state in which each of the frequency of the carrier of the radio signal from the radio transmitter and the frequency of the local oscillation circuit of the radio receiver is set to a predetermined value.

However, frequency drift in which an oscillation frequency varies in accordance with a temperature change, a time-lapse change in a circuit constant, and a time-lapse change in an oscillator often occurs in an oscillation circuit for transmitting or receiving radio signals. If a carrier frequency of a radio signal transmitted from the radio transmitter or an oscillation frequency of the local oscillation circuit of the radio receiver deviates from a predetermined value due to such a frequency drift, the frequency of an intermediate-frequency signal acquired by mixing the radio signal with the local oscillation signal in the receiver deviates from a predetermined value. Thus, there is a problem in that if the deviation of the intermediate-frequency signal increases, transmission and reception of the radio signal cannot be performed.

When a wide frequency band is used for a radio signal, the frequency deviation problem may be ignored even if a certain amount of frequency drift occurs. In contrast, signal noise that is produced when a radio signal is received increases in proportion as the frequency bandwidth for the radio signal increases. Thus, a problem occurs in that the reception sensitivity is reduced and communication reliability, such as a BER (Bit Error Rate), decreases. Thus, the communication reliability must be improved by using a narrow frequency band for the radio signal.

Normally, when transmission and reception of a radio signal must be performed under the above-described conditions in which a narrow frequency band is used for the radio signal, a method is used in which the influence of a frequency drift is compensated for without degrading the communication reliability, by providing an oscillator having a temperature compensation function, such as a TCXO, as a reference oscillation signal source.

According to this method, since the frequency drift is compensated for by the oscillator having the temperature compensation function, even if the frequency bandwidth for a radio signal is narrow, transmission and reception of the radio signal is reliably performed.

However, when the oscillator having the temperature compensation function, such as a TCXO, is used, the unit cost of such an oscillator is substantially greater than an oscillator which does not have a temperature compensation function. Thus, there is a problem in that the overall cost of the entire radio communication system is increased.

Thus, radio communication systems that compensate for the influence of a frequency drift without using an oscillator having the temperature compensation function, such as a TCXO, are disclosed in Japanese Unexamined Patent Application Publication No. 08-139773 (Patent Document 1) and Japanese Unexamined Patent Application Publication No. 11-348732 (Patent Document 2).

In Patent Document 1, prior to transmission of information to be communicated, a radio transmitter performs FSK modulation on a signal including a bit synchronization signal and transmits the FSK-modulated signal (a preamble method), and a radio receiver receives the signal and controls a local oscillation circuit to have a frequency at which the level of the reception signal is maximized. The radio system described in Patent Document 1 ensures establishment of communication by synchronizing, in advance, the frequency of the local oscillation circuit of the radio receiver with a frequency corresponding to a carrier frequency.

In addition, in Patent Document 2, a radio receiver sweeps an oscillation frequency of a local oscillation circuit, monitors the strength of a reception signal (RSSI: Radio Signal Strength Indicator), and stops sweeping the oscillation frequency when the strength of the reception signal reaches a high level. Accordingly, the oscillation frequency of the local oscillation circuit is adjusted. In addition, when the strength of the reception signal reaches a high level, the bandwidth of an IF signal filter is switched from a wide bandwidth to a narrow bandwidth. Accordingly, the BER is reduced, and the reception sensitivity is improved.

In the communication systems described in Patent Documents 1 and 2, even if the frequency bandwidth for a radio signal is narrowed, the influence of a frequency drift is compensated for. In contrast, however, the communication system described in Patent Document 1 requires a circuit for switching between a bit synchronization signal and a radio signal. Thus, this communication system requires a large, complicated circuit. In addition, the communication system described in Patent Document 2 requires an RSSI monitoring circuit, a plurality of filters, a filter switching circuit, and other additional circuits. Thus, this communication system also requires a large complicated circuit, and has a problem of degradation of communication reliability. As described above, in the related art, the number of component parts increases, and the area required on an IC increases. Thus, a new problem arises in that the cost of the entire radio communication system is substantially increased.

As described above, in the related art, the influence of a frequency drift can be corrected while ensuring communication reliability by narrowing the frequency bandwidth for a radio signal. However, at the same time, such a circuit is complicated, the number of component parts increases, and the area required on an IC increases. Thus, a problem arises in that the cost of the entire communication system is increased.

SUMMARY OF THE INVENTION

To overcome the problems described above, preferred embodiments of the present invention provide a radio receiver and a radio transmitter that compensate for the influence of a frequency drift, while ensuring communication reliability, and that have simple, relatively inexpensive configurations.

A radio receiver according to a preferred embodiment of the present invention includes an oscillation frequency control circuit that repeatedly sweeps an oscillation frequency of a local oscillation circuit without stopping over a frequency bandwidth that is equal to or greater than the width of a frequency drift in a carrier frequency of a radio transmitter that transmits a radio signal or over a frequency bandwidth that is equal to or greater than the width of a frequency drift in the oscillation frequency of the local oscillation circuit. Sweeping is not stopped at any frequency during a sweep operation.

As described above, sweeping the oscillation frequency of a local oscillation signal enables demodulation of a transmission signal superimposed on a carrier.

A superheterodyne radio receiver that mixes a radio signal with a local oscillation signal so as to be converted into an intermediate-frequency signal is described first. In the superheterodyne radio receiver, when an oscillation frequency of the local oscillation signal is swept, the frequency of the intermediate-frequency signal is also swept.

When a frequency drift occurs in a carrier from a radio transmitter, if the frequency of the local oscillation circuit of the radio receiver is swept over a frequency bandwidth that is equal to or greater than the width of the frequency drift in the carrier, the frequency of the intermediate-frequency signal varies over a frequency band including a design value. Thus, in the process of the sweep operation, the intermediate-frequency signal temporarily has a frequency at which a radio signal can be received, and at which a transmission signal can be demodulated. As a result, the drift in the carrier frequency is compensated for.

In addition, where a frequency drifts from a proper value when a signal to be swept is not applied to a local oscillation signal of the radio receiver, if the frequency of the local oscillation circuit of the radio receiver is swept over a frequency bandwidth that is equal to or greater than the width of the frequency drift in the local oscillation signal, the frequency of an intermediate-frequency signal varies over a frequency band including a design value. Thus, during the sweep operation, the intermediate-frequency signal temporarily has a frequency at which a radio signal can be received, and at which a transmission signal can be demodulated. As a result, the frequency drift in the local oscillation signal is compensated for.

A direct-conversion radio receiver is described below, which includes, for example, a quadrature detector, and in which a high-frequency signal from an antenna is directly multiplied by a local oscillation signal so as to be converted into a baseband quadrature signal. For the direct-conversion radio receiver, since a carrier frequency is selected based on the frequency of the local oscillation signal, if an oscillation frequency of the local oscillation signal is swept, a received carrier frequency is equivalently swept.

When a frequency drift occurs in a carrier from a radio transmitter, if the frequency of a local oscillation circuit of the radio receiver is swept over a frequency bandwidth that is equal to or greater than the width of the frequency drift, a received carrier frequency varies over a frequency band including a design value. Thus, in the process of the sweep operation, a radio signal of a predetermined carrier frequency is temporarily received, and demodulation is performed. As a result, the drift in the carrier frequency is compensated for.

In addition, where a frequency drift from a proper value occurs when a signal to be swept is not applied to a local oscillation signal of the radio receiver, if the frequency of the local oscillation circuit of the radio receiver is swept over a frequency bandwidth that is equal to or greater than the width of the frequency drift in the local oscillation signal, a received carrier frequency varies over a frequency band including a design value. Thus, in the process of the sweep operation, a radio signal of a predetermined carrier frequency is temporarily received, and demodulation is performed. As a result, the frequency drift in the local oscillation signal is compensated for.

Accordingly, unlike the related art, a radio receiver and a radio transmitter are not required to detect respective frequency drifts, to perform feedback, and to achieve synchronization. Thus, the influence of a frequency drift can be compensated for with a simple circuit configuration.

A radio transmitter according to another preferred embodiment of the present invention includes an oscillation frequency control circuit that repeatedly sweeps an oscillation frequency of an oscillation circuit over a frequency bandwidth that is equal to or greater than the width of a frequency drift in a local oscillation frequency of a radio receiver that receives a radio signal or over a frequency bandwidth that is equal to or greater than the width of a frequency drift in the oscillation frequency of the oscillation circuit. Sweeping is not stopped at any frequency during a sweep operation.

As described above, since the oscillation frequency of the oscillation circuit is swept in the radio transmitter, a radio receiver is capable of demodulating a transmission signal superimposed on a carrier.

When the oscillation frequency of the oscillation circuit is swept in the radio transmitter, the frequency of the carrier is also swept.

Where a frequency drift from a proper value occurs when a signal to be swept is not applied to an oscillation frequency of the oscillation circuit of the radio transmitter, if the frequency of the oscillation circuit of the radio transmitter is swept over a frequency bandwidth that is equal to or greater than the width of the frequency drift, the frequency of a carrier varies over a frequency band including a design value. Thus, in the process of the sweep operation, the frequency of the carrier is temporarily a frequency at which a radio receiver is capable of performing reception, which is a design value, and a transmission signal can be demodulated. As a result, a drift in the carrier frequency is compensated for.

In addition, when a frequency drift occurs in a local oscillation signal of a radio receiver, if the frequency of the oscillation circuit of the radio transmitter is swept over a frequency bandwidth that is equal to or greater than the width of the frequency drift in the local oscillation signal, the frequency of a carrier varies over a frequency band including the frequency drift in the local oscillation signal of the radio receiver. Thus, in the process of the sweep operation, the frequency of the carrier is temporarily a frequency at which the radio receiver is capable of receiving a radio signal, and a transmission signal can be demodulated. As a result, the frequency drift in the local oscillation signal is compensated for.

Accordingly, unlike the related art, a radio transmitter and a radio receiver do not need to detect respective frequency drifts, to perform feedback, and to achieve synchronization. Thus, the influence of a frequency drift can be compensated for with a simple circuit configuration.

In addition, the transmission signal is a digital data signal including an error correction code.

Thus, even if all of the codes of a digital data signal cannot be received and communication reliability, such as a BER, is insufficient, a code can be recovered, and predetermined control can be performed.

In addition, the transmission signal is a digital data signal in which codes having identical content are repeated within a repetition period in which the oscillation frequency control circuit sweeps the oscillation frequency.

As described above, when codes that have a relatively short length and that include the same content are repeatedly transmitted, a relatively short time is required to perform information transmission of each of the codes. Thus, even if a period during which the radio receiver is capable of performing reception and demodulation is short, communication can be performed within the period.

In addition, since codes having the same content are transmitted and received a plurality of times, the codes having the same content are transmitted and received over almost the entire frequency band in which a frequency changes due to the sweep operation. Thus, demodulation of a transmission signal can be performed using a code with the best communication reliability, such as a BER, from among the codes having the same content. Therefore, high-quality communication is performed.

In addition, the oscillation frequency control circuit linearly changes the frequency within the repetition period of the sweep. Thus, the waveform of a frequency change caused by sweep is a triangular shape.

According to preferred embodiments of the present invention, establishment of communication between a radio transmitter and a radio receiver is ensured with a simple circuit by compensating for the influence of a frequency drift in a low-accuracy oscillator.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A first preferred embodiment in which an oscillation frequency of a superheterodyne radio receiver that receives an FSK radio signal is swept will be described.

Figure 1:
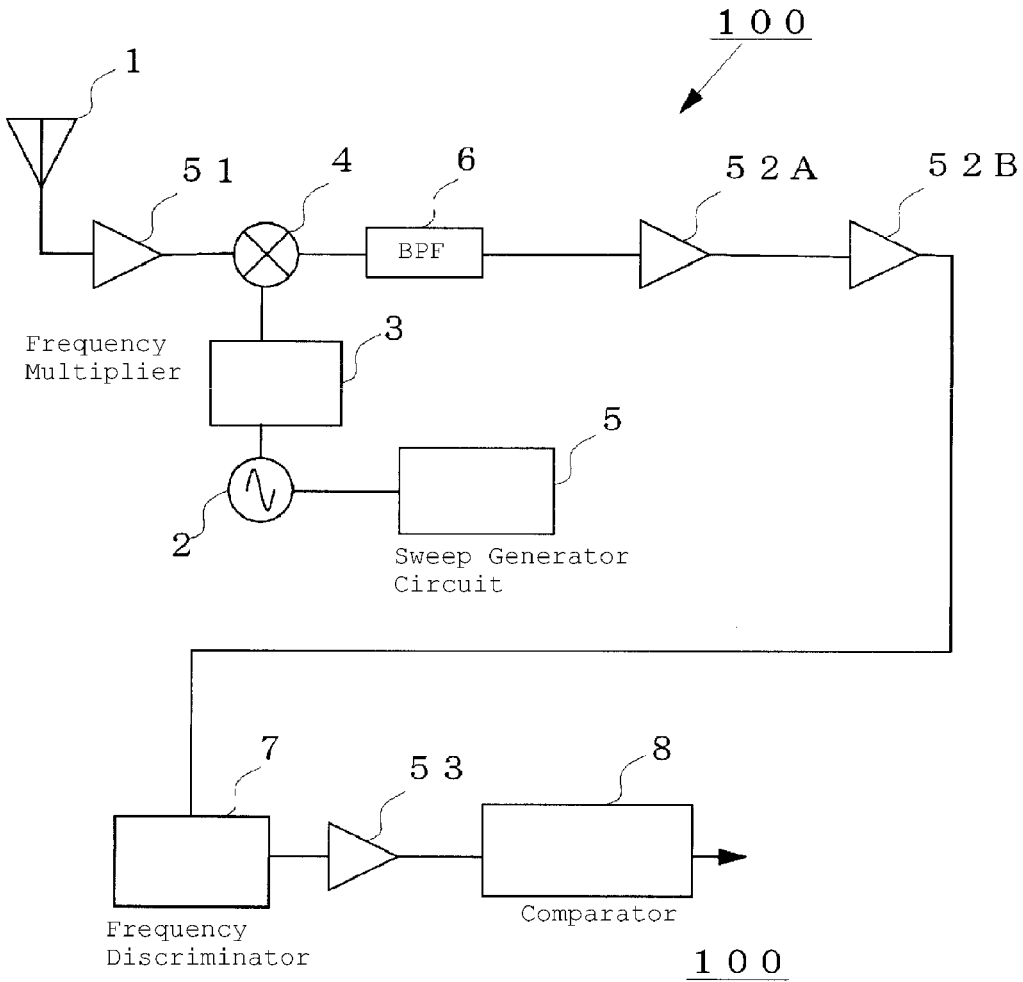
FIG. 1 is a block diagram showing the configuration of a radio receiver according to a first preferred embodiment of the present invention.

FIG. 1 is a block diagram showing the configuration of the first preferred embodiment of the present invention.

In this preferred embodiment, a radio receiver 100 receives from an aerial wire 1 a radio signal having a carrier in the 315 MHz frequency band, and outputs the radio signal to a high-frequency amplifier 51. A frequency multiplier 3 multiplies an oscillation signal of a voltage-controlled 38 MHz oscillator VCXO 2 by eight. The VCXO 2 and the frequency multiplier 3 define a local oscillation circuit. In an ideal state in which no frequency drift occurs and sweep is not performed, when the frequency multiplier 3 multiplies the frequency of the VCXO 2, which is 38.0375 MHz, by eight, a local oscillation signal of 304.3 MHz is acquired. In addition, a mixer circuit 4 mixes this local oscillation signal with the carrier of 315 MHz, and an intermediate-frequency signal (hereinafter, referred to as an IF signal) of 10.7 MHz is acquired.

In practice, since a frequency drift occurs in each of the carrier frequency of the radio signal from a radio transmitter and the local oscillation signal of the local oscillation circuit of the radio receiver 100, these frequencies deviate to some extent. Thus, a sweep signal from a sweep generator circuit 5 is applied to a control terminal of the VCXO 2, and the oscillation frequency is swept. In the sweep generator circuit 5, sweep is not stopped at any frequency during a sweep operation.

The mixer circuit 4 mixes the swept local oscillation signal with the radio signal received by the aerial wire 1 to produce an IF signal. A band pass filter 6 in the subsequent stage filters the IF signal, and outputs the filtered IF signal to a frequency discriminator 7 via two intermediate-frequency amplifiers 52A and 52B. The frequency discriminator 7 performs FM detection on the IF signal, and outputs the IF signal to a comparator 8 via a DC amplifier 53. The comparator 8 performs digital signal demodulation on the IF signal.

For example, when the carrier frequency of the radio signal is 313.5 MHz due to a 1.5 MHz deviation caused by a frequency drift, if the sweep generator circuit 5 is not used, the frequency of the local oscillation signal is maintained at 304.3 MHz, which is a predetermined value. Thus, the frequency of the IF signal is 9.2 MHz, which deviates from the above-described specified frequency of the IF signal, 10.7 MHz. Thus, the radio signal cannot be received, and demodulation of a transmission signal cannot be performed.

In contrast, according to this preferred embodiment of the present invention, where sweep is repeatedly performed over a frequency bandwidth of, for example, 5 MHz using the sweep generator circuit 5, the local oscillation frequency is swept over a width of 2.5 MHz in each of the upward and downward directions centered on 304.3 MHz. When the local oscillation frequency is 302.8 MHz, the frequency of the IF signal is 10.7 MHz, which is the specified value. Thus, the transmission signal can be demodulated. Since the sweep width of the local oscillation frequency is 5 MHz, if the carrier frequency is within a range between about 312.5 MHz and about 317.5 MHz, that is, if the deviation of the frequency is ±2.5 MHz or less, transmission and reception can also be performed. Since sweep is not stopped in the middle of a sweep operation, a period during which the frequency of the IF signal is within a range in which transmission and reception can be performed is short.

In addition, if the carrier frequency is 315.0 MHz, which is the predetermined value, and the frequency of the local oscillation signal is 302.8 MHz due to 1.5 MHz deviation from 304.3 MHz, which is the predetermined value, normally, the frequency of the IF signal is 9.2 MHz, which deviates from the specified value, 10.7 MHz. Thus, the transmission signal cannot be demodulated. However, in this preferred embodiment, the frequency of the local oscillation circuit is swept over a frequency bandwidth of, for example, 5 MHz, which is 2.5 MHz in each of the upward and downward directions. Thus, even if the local oscillation signal deviates by 1.5 MHz due to a frequency drift, the deviated frequency of the local oscillation signal is swept, and a period during which the local oscillation frequency is the predetermined value, 304.3 MHz, is generated. Thus, the IF signal reaches the specified value, 10.7 MHz, and the transmission signal can be demodulated within the period.

Accordingly, if the oscillation frequency of the local oscillation circuit is within the range between 301.8 MHz and 306.8 MHz, that is, if the deviation of the frequency of the local oscillation circuit due to the frequency drift is ±2.5 MHz or less, the radio signal can also be received. Since sweep is not stopped in the middle of a sweep operation, a period during which the frequency of the IF signal is within a range in which transmission and reception can be performed is short.

In addition, even when both the carrier frequency and the center frequency of the sweep range of the local oscillation circuit deviate, if only a period during which the frequency of the IF signal is within a specified range is generated anywhere in the sweep range, reception can be performed. Thus, the sweep range of the local oscillation circuit can be determined in accordance with assumed or permitted maximum values of deviations in the transmitter and the receiver.

The present invention is not limited to this preferred embodiment. The present invention can also be applied to an ASK digital data modulation method and analog data modulation method, as well as the FSK digital data modulation method and analog data modulation method. In addition, the present invention is also applicable to a double-superheterodyne radio receiver or other suitable receivers.

In addition, as a circuit for performing FSK demodulation, a detector circuit, such as a ratio detector, a Foster detector, or a slope detector, may be used, as well as a frequency discriminator. In addition, a sweep waveform may be a triangular waveform, a staircase waveform, or other suitable waveform. In order to generate a staircase waveform, a sweep generator circuit including a counter circuit for generating a digital value and an analog/digital converter circuit that are connected to each other generate an analog-converted counter value as a sweep signal.

Figure 2:
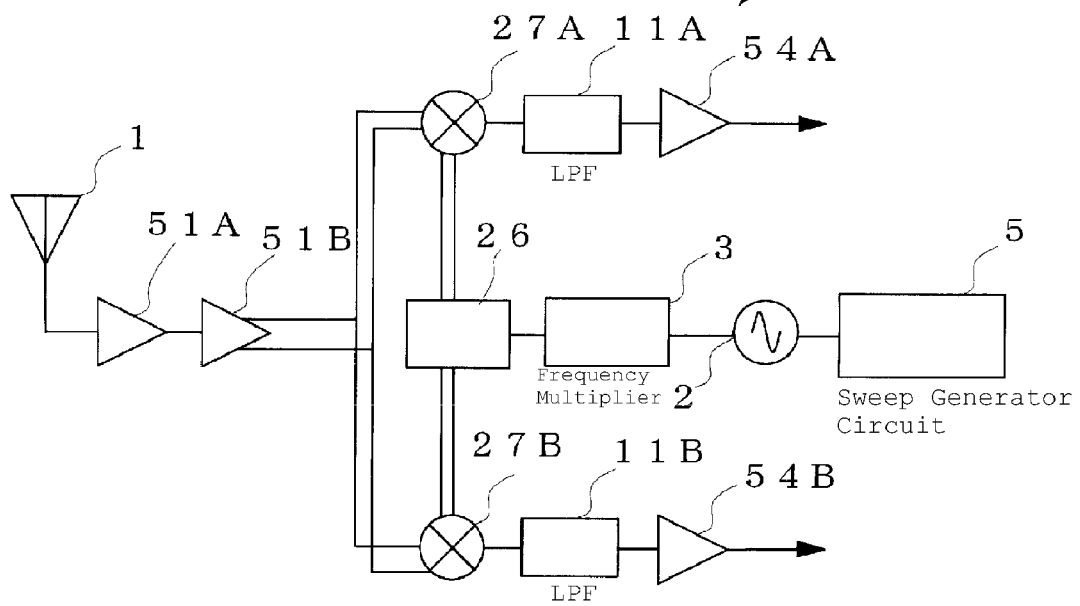
FIG. 2 is a block diagram showing the configuration of a radio receiver according to a second preferred embodiment of the present invention.

A second preferred embodiment in which a local oscillation frequency of a direct-conversion radio receiver that receives a QPSK radio signal is swept is described below. FIG. 2 is a block diagram showing the configuration of this preferred embodiment.

In the direct-conversion radio receiver, using a quadrature detector, a high-frequency signal from an antenna is directly multiplied by a local oscillation signal so as to be converted into a baseband quadrature signal, and demodulation is performed. Since a carrier frequency is selected based on the frequency of the local oscillation signal, if the oscillation frequency of the local oscillation signal is swept, the received carrier frequency is equivalently swept.

In this preferred embodiment, the radio receiver 100 receives a radio signal from the aerial wire 1, and outputs, to each of two quadrature detector circuits 27A and 27B, a signal amplified by two high-frequency amplifiers 51A and 51B. The frequency multiplier 3 performs multiplication on an oscillation signal of the voltage-controlled oscillator VCXO 2. The VCXO 2 and the frequency multiplier 3 define a local oscillation circuit. In addition, a local oscillation signal from the local oscillator circuit is output to the quadrature detector circuits 27A and 27B via a phase device 26 as two signals having a phase difference of 90 degrees. Here, the local oscillation frequency is swept by applying a sweep waveform from the sweep generator circuit 5 to a frequency control terminal of the VCXO 2. In the sweep generator circuit 5, sweeping is not stopped at any frequency during a sweep operation. The quadrature detector circuit 27A directly multiplies the radio signal by the local oscillation signal to convert the radio signal into a baseband quadrature signal, and outputs the baseband quadrature signal via an LPF 11A and an amplifier 54A. In addition, the quadrature detector circuit 27B directly multiplies the radio signal by the local oscillation signal to convert the radio signal into a baseband quadrature signal, and outputs the baseband quadrature signal via an LPF 11B and an amplifier 54B.

When a frequency drift occurs in a carrier from a radio transmitter, if the frequency of the local oscillation circuit of the radio receiver is swept over a frequency bandwidth that is equal to or greater than the width of the frequency drift, the received carrier frequency varies over a frequency band including a design value. Thus, in the process of the sweep operation, the actual carrier frequency can be temporarily selected based on the frequency of the local oscillation signal. Thus, the radio signal can be received, and a transmission signal can be demodulated. As a result, the drift in the carrier frequency is compensated for.

In addition, when a frequency drift occurs in the local oscillation signal of the radio receiver, if the frequency of the local oscillation signal is swept over a frequency bandwidth that is equal to or greater than the width of the frequency drift in the local oscillation signal, the received carrier frequency varies over a frequency band including a design value. Thus, in the process of the sweep operation, the radio signal at the specified carrier frequency is temporarily received, and demodulation is performed. As a result, the frequency drift in the local oscillation signal is compensated for.

As a third preferred embodiment of the present invention, a keyless entry system in a superheterodyne radio receiver that performs sweep with a sweep signal having a sawtooth waveform is described below. The present invention can also be applied to a radio communication system that transmits and receives a control code having a short length, as well as the keyless entry system.

Figure 3A:
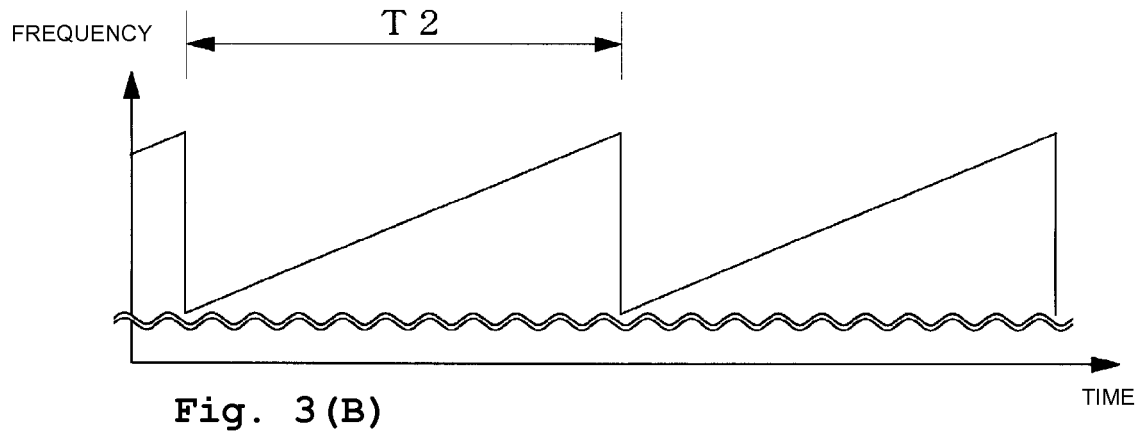
FIGS. 3(A)-3(C) include schematic diagrams of a sweep waveform and a radio signal according to a third preferred embodiment of the present invention.
Figure 3B:
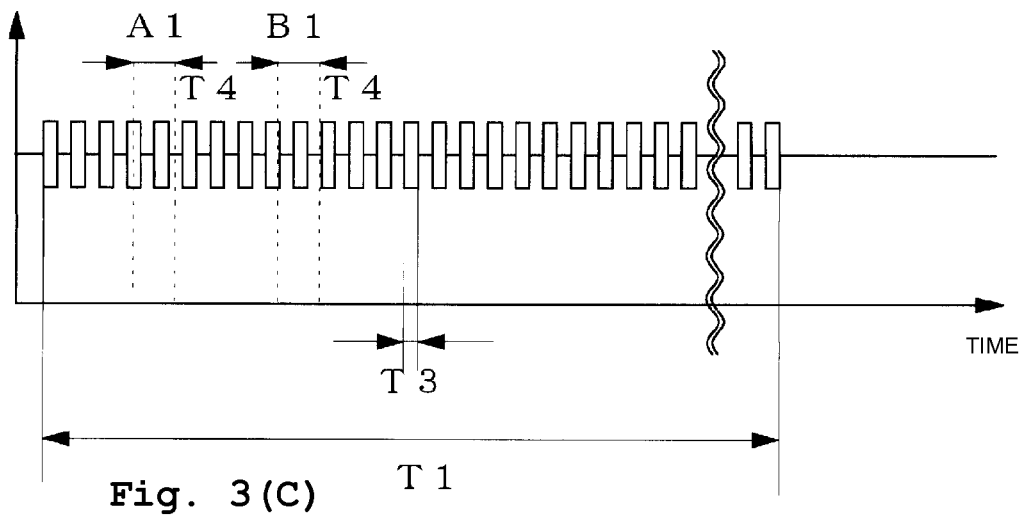

FIG. 3(A) shows the frequency sweep waveform of the receiver, and FIG. 3(B) is a schematic diagram showing a data signal of a transmitted radio signal.

In this preferred embodiment, a radio transmitter that transmits the radio signal is a so-called key used in the keyless entry system. The key is integrated with a car key, and transmits the radio signal in 315 MHz frequency band as a pulse-burst signal. In addition, a control signal, an identification code, an FEC error correction code, and other suitable signals are superimposed together on one burst in a bit/byte interleave method. Thus, the radio receiver is capable of demodulating data even with a certain degree of BER, and since the bit/byte interleave method is used, a multipath environment is supported. In addition, burst portions (bit sequences) on which the same content is superimposed are repeatedly transmitted a plurality of times during a user key operation.

When the data communication speed is 2400 bps and the amount of information superimposed on a burst is 25 bits, it takes about 10.4 milliseconds (period T3) to transmit one burst, as shown in FIG. 3(B). In addition, if it takes about 1 second (period T1) for a user of the keyless entry system to perform an operation for the key, which is the radio transmitter, about 96 bursts having the same content are repeatedly transmitted during period T1 in accordance with the user operation.

In the radio receiver, when a sweep generator circuit applies a sweep signal having a sawtooth waveform in a period of 200 milliseconds (period T2) to a control terminal of a local oscillation circuit, as shown in FIG. 3(A), the radio transmitter transmits about 18 bursts during the sweep period (T2).

Figure 3C:
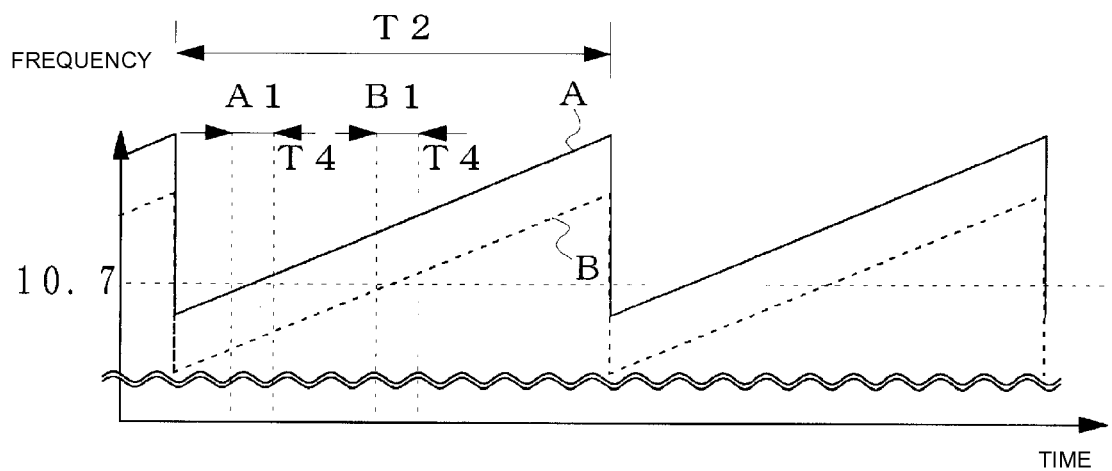

In addition, when frequencies at which a transmission signal can be demodulated from an IF signal are a frequency bandwidth of ±25 kHz centered on 400 kHz and sweep is performed over a frequency bandwidth of ±150 kHz centered on 400 kHz, a period during which the frequency of the IF signal is within the frequency bandwidth of ±25 kHz centered on 400 kHz is about 33 milliseconds (period T4), as shown in FIG. 3(C). About 3.2 bursts can be transmitted and received during the period T4.

Thus, the radio signal of the keyless entry system is demodulated, and authentication of the radio transmitter is performed in accordance with an identification code for each car superimposed on the radio signal. When authentication of the identification code is achieved, an operation designated by a control code, such as opening of a door, can be controlled.

As in the above-described example of the keyless entry system, if the amount of information is small, a burst signal can be transmitted by short-time radio communication. Thus, even if the period during which the IF signal has a predetermined frequency at which demodulation can be performed is short, most of the information included in one burst signal can be transmitted. In addition, since the radio transmitter repeatedly transmits radio signals of the same content, the radio receiver is capable of receiving bursts of the same content a plurality of times. Thus, since information received in a burst with the best BER from among a plurality of bursts is demodulated, transmission and reception of a radio signal with high quality and a reduced BER, as compared to when sweep is not performed, is achieved.

Here, a situation in which the carrier frequency of the radio receiver deviates due to the influence of a frequency drift is described. In FIG. 3(C), a deviated signal is represented by a solid line A and a signal of a design value before the deviation is represented by a broken line B.

If a frequency drift occurs in the carrier frequency from the key of the keyless entry system, the frequency of the IF signal deviates from the broken line B to the solid line A. Thus, a burst signal within a section B1, which is an IF signal originally having a frequency at which demodulation can be performed, which is about 10.7 MHz, becomes an IF signal having a frequency at which demodulation cannot be performed. However, since, due to mixture with a local oscillation signal, a burst signal within a section A1 becomes an IF signal having a frequency of 10.7 MHz at which demodulation can be performed, even if the frequency drift occurs, the IF signal has a predetermined frequency at which demodulation can be performed.

In addition, if a plurality of bursts is received, since a burst having an outstanding BER is included in the plurality of bursts, transmission and reception of a radio signal having a high quality and a reduced BER, as compared to a situation in which sweep is not performed, is achieved.

Figure 4:
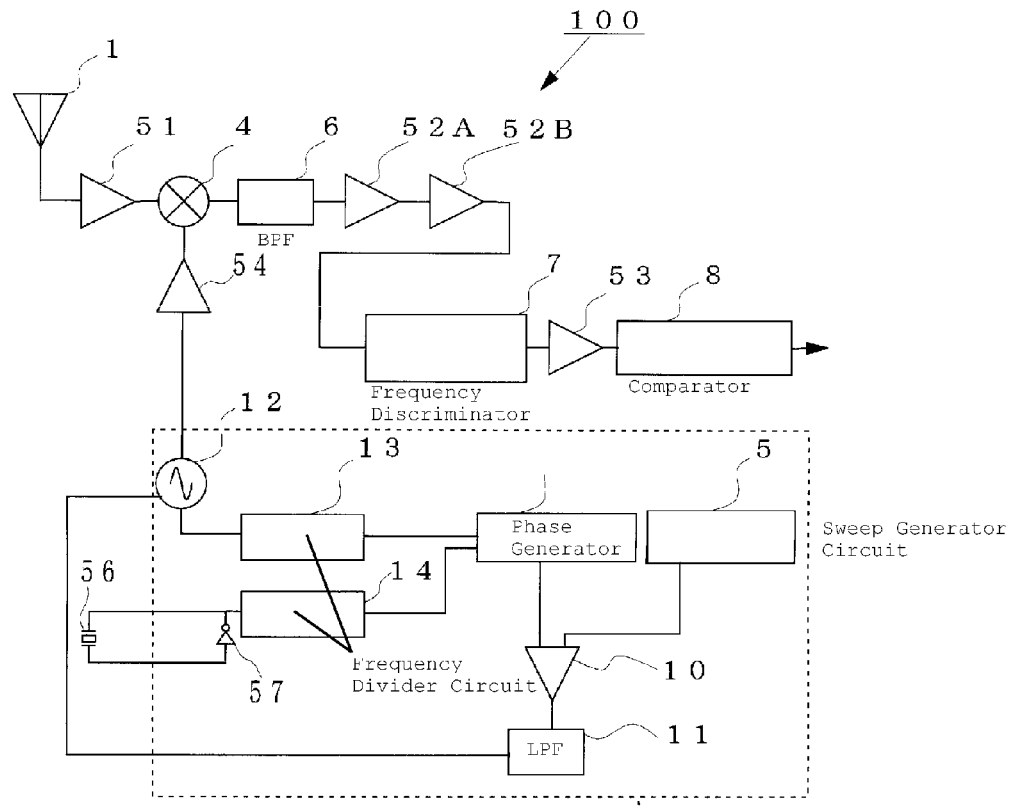
FIG. 4 is a block diagram showing the configuration of a radio receiver according to a fourth preferred embodiment of the present invention.

As a fourth preferred embodiment, an example in which a local oscillation circuit of a radio receiver includes a PLL synthesizer is described below. The use of the PLL synthesizer increases a selectable range of a local oscillation frequency. FIG. 4 is a block diagram of the radio receiver in this preferred embodiment.

The radio receiver 100 receives from the aerial wire 1 a radio signal having a carrier in the 315 MHz frequency band, and outputs the radio signal to the high-frequency amplifier 51.

In a PLL synthesizer 50, a frequency divider circuit 13 divides the frequency of an oscillation signal of a VCO 12, and supplies the frequency-divided signal to one input of a phase comparator 9. A frequency divider circuit 14 divides the frequency of an oscillation signal of a resonant circuit defined by a quartz oscillator 56 functioning as a reference signal source and an inverting amplifier 57, and supplies the frequency-divided signal to the other input of the phase comparator 9. The phase comparator 9 compares the phases of the two signals from the frequency divider circuit 13 and the frequency divider circuit 14, and an adding circuit 10 provided in the subsequent stage of the phase comparator 9 adds a sweep signal from the sweep generator circuit 5 and an output of the phase comparator 9. A low pass filter (LPF) 11 filters the added signal and determines a loop characteristic. An output of the LPF 11 is supplied to a frequency control terminal of the VCO 12. Accordingly, the VCO 12 outputs the swept local oscillation signal to the mixer circuit 4 via an amplifier 54.

In addition, by mixing the local oscillation signal with the carrier of 315 MHz in the mixer circuit 4, an intermediate-frequency signal of 10.7 MHz (hereinafter, referred to as an IF signal) is acquired.

The mixer circuit 4 mixes the swept local oscillation signal with the radio signal received by the aerial wire 1 to produce an IF signal. The band pass filter 6 in the subsequent stage filters the IF signal, and outputs the filtered IF signal to the frequency discriminator 7 via the two intermediate-frequency amplifiers 52A and 52B. The frequency discriminator 7 performs FM detection on the IF signal, and outputs the IF signal to the comparator 8 via the DC amplifier 53. The comparator 8 performs digital signal demodulation on the IF signal.

Normally, the PLL circuit intends to always output a signal at a predetermined frequency. However, if the oscillation frequency of the VCO 12 deviates from a predetermined value, the supply voltage of the VCO 12 is controlled such that the oscillation frequency of the VCO 12 is maintained at the predetermined value. Thus, the oscillation frequency of the VCO 12 is moderately tuned to the predetermined frequency in accordance with a time constant of the PLL loop of the PLL synthesizer 50.

Here, the sweep generator circuit 5 generates a sweep signal having a triangular waveform or other suitable waveform, and the adding circuit 10 adds the sweep signal to an output of the phase comparator 9. In a normal PLL circuit, the output of the phase comparator 9 is directly input to the LPF 11 and proper feedback is performed. However, with the sweep generator circuit 5, a transmission signal is superimposed as a disturbance on the amount of feedback. As a result, the frequency of the local oscillation signal, which is an output of the PLL synthesizer 50, is swept with the lapse of time. However, since an operation for sweeping the oscillation frequency of the VCO 12 in accordance with a sweep signal is detrimental to a tuning operation of the PLL circuit, although the waveform of a frequency change of the local oscillation signal, which is an output of the PLL synthesizer 50, and the waveform of the sweep signal have the same cycle, the phase and waveform of the local oscillation signal are different from the phase and waveform of the sweep signal.

As described above, even if a PLL synthesizer and a sweep generator circuit are used, an IF signal can be swept. Sweep is not stopped in the middle of a sweep operation.

If a carrier frequency deviates from a predetermined value due to the influence of a frequency drift, normally, the frequency of an IF signal deviates from a specified frequency at which demodulation can be performed. Thus, a transmission signal cannot be demodulated. However, in this preferred embodiment, the sweep generator circuit 5 sweeps the local oscillation frequency from the PLL synthesizer 50. Thus, the frequency of an IF signal acquired by mixing the local oscillation signal and a radio signal by the mixer circuit 4 is swept. Due to the deviation of a carrier frequency caused by a frequency drift and the sweep of the frequency of the local oscillation signal, a period during which the frequency of the IF signal is within a predetermined range is generated. Thus, a transmission signal can be demodulated in the period during which the frequency of the IF signal is within the predetermined frequency range, and a radio signal can be received. Since sweep is not stopped in the middle of a sweep operation, a period during which the frequency of the IF signal is within a range in which transmission and reception can be performed is short.

In addition, even when a carrier frequency is a predetermined value, if a local oscillation frequency from the PLL synthesizer 50 deviates from a predetermined value, normally, the frequency of an IF signal also deviates from a specified value. Thus, a transmission signal cannot be demodulated. However, in this preferred embodiment, the local oscillation frequency deviated due to a frequency drift is swept. Thus, a period during which the local oscillation frequency is within a predetermined range is generated. Even if the center of a sweep range of the local oscillation frequency from the PLL synthesizer 50 deviates from a proper value of the local oscillation frequency, a radio signal can be received as long as the predetermined value is in the sweep range. Since sweep is not stopped in the middle of a sweep operation, a period during which the frequency of the IF signal is within a range in which transmission and reception can be performed is short.

As described above, even when the sweep generator circuit 5 is included within the PLL synthesizer 50, the influence of a frequency drift is compensated for by sweeping an IF signal. In addition, with the use of the PLL synthesizer 50, an inexpensive quartz oscillator XO of a general-purpose frequency can be used as a reference signal source. Thus, the total cost is reduced.

A local oscillation signal can be swept by using a very large time constant of the PLL circuit and using a sweep signal of a rectangular waveshape having a cycle that is greater than a time required for the PLL synthesizer to perform tuning. In this case, the frequency of the local oscillation signal changes from a predetermined value in accordance with rising of the sweep signal of the rectangular waveshape. Then, the local oscillation frequency is moderately converged into the predetermined value in accordance with a tuning operation performed by the PLL synthesizer. Then, the local oscillation signal begins to change again in accordance with falling of the sweep signal, and the local oscillation frequency is converged into the predetermined value in accordance with a tuning operation. By repeating this frequency modulation, the local oscillation frequency can be periodically swept.

Figure 5:
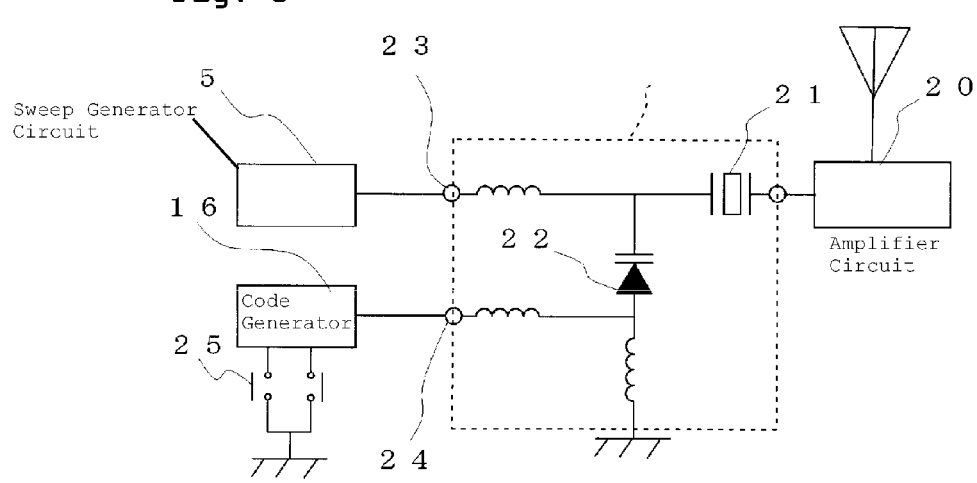
FIG. 5 is a block diagram showing the configuration of a radio transmitter according to a fifth preferred embodiment of the present invention.

As a fifth preferred embodiment, an example in which a carrier frequency of a radio transmitter is swept is shown in FIG. 5.

In the fifth preferred embodiment, a radio transmitter that transmits an FSK-modulated carrier in a 325 MHz frequency band is described. In the radio transmitter, a variable capacitance diode 22 is connected to a surface acoustic wave resonator 21, a frequency control terminal 23 connected to the sweep generator circuit 5 is connected to the cathode of the variable capacitance diode 22, and a frequency control terminal 24 connected to a code generator 16 is connected to the anode of the variable capacitance diode 22. The code generator 16 includes a switch circuit 25 for performing predetermined control for keyless entry. A sweep signal from the sweep generator circuit 5 is applied to the frequency control terminal 23 of a voltage-controlled resonant circuit 15, and a control code signal from the code generator 16 is applied to the frequency control terminal 24 in accordance with an operation using the switch circuit 25. The voltage-controlled resonant circuit 15 and an amplifier circuit 20 define an oscillation circuit.

Applying the sweep signal to the frequency control terminal 23 of the voltage-controlled resonant circuit 15 sweeps the oscillation frequency, and applying voltage to the frequency control terminal 24 of the voltage-controlled resonant circuit 15 performs FSK modulation. Accordingly, the frequency of the surface acoustic wave resonator 21 is modulated using the sweep signal and the code signal, the modulated signal is amplified by the amplifier circuit 20, and the amplified signal is transmitted as a radio signal.

If the frequency of the surface acoustic wave resonator 21 of the radio transmitter deviates from a predetermined value due to the influence of a frequency drift, normally, the frequency of an IF signal in a radio receiver deviates from a predetermined frequency at which demodulation can be performed. Thus, a transmission signal cannot be demodulated. However, in this preferred embodiment, the frequency of the surface acoustic wave resonator 21 deviated due to a frequency drift is swept by the sweep generator circuit 5. Thus, the deviated frequency is modulated by the sweep, and a period during which the frequency of the surface acoustic wave resonator 21 is a predetermined value is generated. Even if the center of a sweep range of the frequency of the surface acoustic wave resonator 21 deviates from a proper value for the surface acoustic wave resonator 21, the radio receiver is capable of receiving a radio signal as long as the predetermined value is included in the sweep range. Sweeping is not stopped in the middle of a sweep operation. As a result, the FSK-modulated codes are demodulated from the received radio signal, a control code and an identification code are read, and a predetermined operation for keyless entry can be performed.

In addition, even when the frequency of the surface acoustic wave resonator 21 of the radio transmitter is a predetermined value, if the frequency of a local oscillation circuit of a radio receiver deviates from a predetermined value, normally, the frequency of an IF signal in the radio receiver also deviates from a predetermined value. Thus, a transmission signal cannot be demodulated. However, in this preferred embodiment, the frequency of the surface acoustic wave resonator 21 of the radio transmitter is swept. Thus, due to the sweep of the frequency of the surface acoustic wave resonator 21 and the deviation of the local oscillation frequency of the receiver caused by a frequency drift, a period during which the frequency of an IF signal in the receiver is a predetermined value is generated. As a result, a transmission signal can be demodulated in the period during which the frequency of the IF signal is the predetermined value. Thus, the FSK-modulated codes are demodulated, the control code and the identification code are read, and a predetermined operation keyless entry can be performed.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A radio receiver comprising:
a radio receiver circuit that receives a radio signal in which a carrier is modulated using a transmission signal;
a local oscillation circuit that oscillates a local oscillation signal;
a demodulation circuit that demodulates the transmission signal on the basis of the radio signal and the local oscillation signal; and
an oscillation frequency control circuit that repeatedly sweeps an oscillation frequency of the local oscillation circuit without stopping over a frequency bandwidth that is equal to or greater than the width of a frequency drift in a carrier frequency of a radio transmitter that transmits the radio signal or over a frequency bandwidth that is equal to or greater than the width of a frequency drift in the oscillation frequency of the local oscillation circuit.

2. The radio receiver according to claim 1, wherein the transmission signal is a digital data signal including an error correction code.

3. The radio receiver according to claim 1, wherein the transmission signal is a digital data signal in which codes having identical content are repeated within a repetition period in which the oscillation frequency control circuit sweeps the oscillation frequency.

4. The radio receiver according to claim 3, wherein the oscillation frequency control circuit linearly changes the oscillation frequency within the repetition period in which the oscillation frequency control circuit sweeps the oscillation frequency.

5. The radio receiver according to claim 1, wherein the radio receiver circuit includes an aerial wire which receives the radio signal.

6. The radio receiver according to claim 1, wherein the local oscillation circuit includes a voltage-controlled 38 MHz oscillator that oscillates the local oscillation signal and a frequency multiplier that multiplies the local oscillation signal by eight.

7. The radio receiver according to claim 1, further comprising a mixer circuit that mixes the local oscillation signal with the carrier.

8. The radio receiver according to claim 1, wherein the carrier has a frequency of about 315 MHz.

9. The radio receiver according to claim 1, wherein the local oscillation circuit includes a PLL synthesizer.

* * * * *